United States Patent
Lu et al.

(10) Patent No.: US 11,587,848 B2
(45) Date of Patent: Feb. 21, 2023

(54) FORMING METAL PLUG THROUGH A HOLE IN A DEVICE INCLUDING A RESISTANCE LAYER AND CONTACTING EMBEDDED CONDUCTIVE STRUCTURES

(71) Applicants: Semiconductor Manufacturing International (Shanghai) Corporation, Shanghai (CN); Semiconductor Manufacturing International (Beijing) Corporation, Beijing (CN)

(72) Inventors: Yi Lu, Shanghai (CN); Xiaohui Zhuang, Shanghai (CN); Yihui Lin, Shanghai (CN); Liang Wang, Shanghai (CN); Le Li, Shanghai (CN); Kaige Gao, Shanghai (CN); Wenjie Zhu, Shanghai (CN); Jialin Zhao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 207 days.

(21) Appl. No.: 17/037,051

(22) Filed: Sep. 29, 2020

(65) Prior Publication Data
US 2021/0210412 A1 Jul. 8, 2021

(30) Foreign Application Priority Data
Jan. 8, 2020 (CN) .......................... 202010018893.8

(51) Int. Cl.
*H01L 23/48* (2006.01)
*H01L 21/48* (2006.01)
(Continued)

(52) U.S. Cl.
CPC ........ *H01L 23/481* (2013.01); *H01L 21/4814* (2013.01)

(58) Field of Classification Search
CPC ........... H01L 21/4814; H01L 21/76879; H01L 21/76805; H01L 21/76877; H01L 23/481; H01L 23/535; H01L 23/5228
See application file for complete search history.

(56) References Cited

U.S. PATENT DOCUMENTS 10,026,687 B1 * 7/2018 Lin .................. H01L 23/53295
2015/0129978 A1 * 5/2015 Moon .................. H01L 23/481
257/394

(Continued)

*Primary Examiner* — Herve-Louis Y Assouman
(74) *Attorney, Agent, or Firm* — Anova Law Group, PLLC

(57) ABSTRACT

Semiconductor structure and its fabrication method are provided. The method includes providing a substrate, where the substrate includes a first region having a first metal structure and a second region having a second metal structure; forming a device layer on each of top surfaces of the substrate, the first metal structure and the second metal structure; forming a first through hole in the device layer at the first region, where the first through hole exposes at least a portion of surfaces of the first metal structure, and forming a second through hole in the device layer at the second region, where the second through hole passes through the first device and exposes at least a portion of surfaces of the second metal structure; and using a selective metal growth process, forming a first plug in the first through hole and forming a second plug in the second through hole.

20 Claims, 6 Drawing Sheets

(51) Int. Cl.
*H01L 21/768* (2006.01)
*H01L 23/522* (2006.01)

(56) References Cited

U.S. PATENT DOCUMENTS

2017/0330805 A1* 11/2017 Warner ............... H01L 21/8221
2018/0374915 A1* 12/2018 Kim .................. H01L 21/76805

* cited by examiner

| Providing a substrate, where the substrate includes a first region having a first metal structure and a second region having a second metal structure, and a top surface of the substrate exposes each top surface of the first metal structure and the second metal structure | S801 |

| Forming a device layer on each of top surfaces of the substrate, the first metal structure and the second metal structure, where the device layer at the second region includes a first device, and a projection of the first device on the top surface of the substrate at least partially overlaps the top surface of the second metal structure | S802 |

| Forming a first through hole in the device layer at the first region, where the first through hole exposes at least a portion of surfaces of the first metal structure, and forming a second through hole in the device layer at the second region, where the second through hole passes through the first device and exposes at least a portion of surfaces of the second metal structure | S803 |

| Using a selective metal growth process, forming a first plug in the first through hole and forming a second plug in the second through hole | S804 |

FIG. 11

FORMING METAL PLUG THROUGH A HOLE IN A DEVICE INCLUDING A RESISTANCE LAYER AND CONTACTING EMBEDDED CONDUCTIVE STRUCTURES

CROSS-REFERENCE TO RELATED APPLICATION

This application claims the priority of Chinese Patent Application No. 202010018893.8, filed on Jan. 8, 2020, the content of which is incorporated herein by reference in its entirety.

TECHNICAL FIELD

The present disclosure generally relates to the field of semiconductor manufacturing and, more particularly, relates to a semiconductor structure and its fabrication method.

BACKGROUND

In current semiconductor manufacturing, an etching process is used to form an opening in an interlayer dielectric layer, and then a conductive material is deposited in the opening to form an electrical connection structure for electrical connection between semiconductor devices. However, existing semiconductor structures may have poor performance.

SUMMARY

One aspect of the present disclosure provides a method for fabricating a semiconductor structure. The method includes providing a substrate, wherein the substrate includes a first region having a first metal structure and a second region having a second metal structure, and a top surface of the substrate exposes each top surface of the first metal structure and the second metal structure; forming a device layer on each of top surfaces of the substrate, the first metal structure and the second metal structure, wherein the device layer at the second region includes a first device, and a projection of the first device on the top surface of the substrate at least partially overlaps the top surface of the second metal structure; forming a first through hole in the device layer at the first region, wherein the first through hole exposes at least a portion of surfaces of the first metal structure, and forming a second through hole in the device layer at the second region, wherein the second through hole passes through the first device and exposes at least a portion of surfaces of the second metal structure; and using a selective metal growth process, forming a first plug in the first through hole and forming a second plug in the second through hole.

Optionally, a material of the first metal structure is same as a material of the second metal structure.

Optionally, a material of the first plug is same as a material of the second plug.

Optionally, materials of the first metal structure, the second metal structure, the first plug, and the second plug are all same.

Optionally, the top surface of the first metal structure is coplanar with the top surface of the second metal structure.

Optionally, the first device includes a resistance layer.

Optionally, the resistance layer is made of titanium nitride.

Optionally, the first device further includes a stop layer on the resistance layer.

Optionally, the device layer includes a first dielectric layer, a second dielectric layer, and the first device between the first dielectric layer and the second dielectric layer.

Optionally, forming the device layer includes forming the first dielectric layer on the each of the top surfaces of the substrate, the first metal structure and the second metal structure; forming the first device on a top surface of the first dielectric layer at the second region; and forming the second dielectric layer on surfaces of the first dielectric layer and the first device.

Optionally, the first dielectric layer is made of a material including silicon oxide, silicon nitride, tantalum nitride, silicon carbide nitride, silicon nitride boride, silicon carbide oxide nitride, silicon oxide nitride, or a combination thereof; and the second dielectric layer is be made of a material including silicon oxide, silicon nitride, tantalum nitride, silicon carbide nitride, silicon nitride boride, silicon carbide oxide nitride, silicon oxide nitride, or a combination thereof.

Optionally, the substrate includes a base substrate and a third dielectric layer on the base substrate; and the first metal structure and the second metal structure are both in the third dielectric layer.

Optionally, a semiconductor device is in the base substrate at the first region, and the first metal structure and the semiconductor device are electrically interconnected to each other.

Optionally, forming the first plug and the second plug includes using the selective metal growth process, forming a plug material layer in the first through hole and the second through hole till a top surface of the plug material layer is coplanar with a top surface of the second dielectric layer or higher than a top surface of the second dielectric layer.

Optionally, forming the first plug and the second plug further includes planarizing the plug material layer till being coplanar with the top surface of the second dielectric layer, wherein the plug material layer is planarized by a chemical mechanical planarization process.

Optionally, the first metal structure is made of a material including tungsten, cobalt, or a combination thereof.

Optionally, the second metal structure is made of a material including tungsten, cobalt, or a combination thereof.

Optionally, the first plug is made of a material including tungsten, cobalt, or a combination thereof.

Optionally, the second plug is made of a material including tungsten, cobalt, or a combination thereof.

Another aspect of the present disclosure provides a semiconductor structure. The semiconductor structure includes a substrate, wherein the substrate includes a first region having a first metal structure and a second region having a second metal structure, and a top surface of the substrate exposes each top surface of the first metal structure and the second metal structure; further includes a device layer on each of top surfaces of the substrate, the first metal structure and the second metal structure, wherein the device layer at the second region includes a first device, and a projection of the first device on the top surface of the substrate at least partially overlaps the top surface of the second metal structure; further includes a first through hole in the device layer at the first region, wherein the first through hole exposes at least a portion of surfaces of the first metal structure; and a second through hole in the device layer at the second region, wherein the second through hole passes through the first device and exposes at least a portion of surfaces of the second metal structure; and includes a first plug in the first through hole and a second plug in the second through hole, each formed using a selective metal growth process.

Compared with the existing technology, the technical solutions provided by the present disclosure may achieve at least the following beneficial effects.

In the method for forming the semiconductor structure provided by the technical solutions of the present disclosure, on the one hand, the first through hole and the second through hole are formed in the device layer, the first plug is formed in the first through hole, and the second plug is formed in the second through hole, such that the height difference between the first plug and the second plug finally formed may be reduced. On the other hand, the first plug and the second plug are formed by the selective metal growth process, the material forming the first plug may start to grow from the bottom of the first through hole, and the material forming the second plug may start to grow from the bottom of the second through hole, such that the height difference between the material of the first plug and the material of the second plug during growth may become small, which is beneficial for the subsequent planarization process, thereby reducing the residues formed on the surface of the device layer by the materials of the first plug and the second plug. Meanwhile, the materials of the first plug and the second plug are difficult to grow on the surface of the device layer, thereby reducing the residues formed on the surface of the device layer by the materials of the first plug and the second plug. The residues formed on the surface of the device layer by the materials of the first plug and the second plug are reduced, and the second through hole passes through the first device, such that, when forming the second plug electrically interconnected to the first device, the influence of the resides on the performance of the semiconductor structure may be reduced, thereby improving the performance of the semiconductor structure.

Furthermore, the materials of the first metal structure and the second metal structure are same. Therefore, the material growth rate difference between the material of the first plug and the material of the second plug may be reduced, and moreover, the height difference between the material of the first plug and the material of the second plug during the growth may be reduced. In such way, it is beneficial for reducing the residues of the materials of the first plug and the second plug formed on the surface of the device layer, thereby improving the performance of the semiconductor structure.

Furthermore, the material of the first plug and the material of the second plug are same. Therefore, the material growth rate difference between the material of the first plug and the material of the second plug may be reduced, and moreover, the height difference between the material of the first plug and the material of the second plug during the growth may be reduced. In such way, it is beneficial for reducing the residues of the materials of the first plug and the second plug formed on the surface of the device layer, thereby improving the performance of the semiconductor structure.

Furthermore, the stop layer is formed on the surface of the resistance layer, such that the oxidation of the resistance layer may be improved; and, during subsequent processes, including etching, for forming the semiconductor structure, the resistance layer may be protected to reduce the influence of subsequent processes including etching on the resistance layer, thereby improving the performance of the semiconductor structure.

BRIEF DESCRIPTION OF THE DRAWINGS

The following drawings are merely examples for illustrative purposes according to various disclosed embodiments and are not intended to limit the scope of the present disclosure.

FIG. 11 illustrates a flowchart of an exemplary fabrication method for forming a semiconductor structure according to various disclosed embodiments of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor structure and its fabrication method are provided. The method includes providing a substrate, where the substrate includes a first region having a first metal structure and a second region having a second metal structure; forming a device layer on each of top surfaces of the substrate, the first metal structure and the second metal structure; forming a first through hole in the device layer at the first region, where the first through hole exposes at least a portion of surfaces of the first metal structure, and forming a second through hole in the device layer at the second region, where the second through hole passes through the first device and exposes at least a portion of surfaces of the second metal structure; and using a selective metal growth process, forming a first plug in the first through hole and forming a second plug in the second through hole.

FIGS. 1-4 illustrate cross-sectional structural schematics of a method for forming an exemplary semiconductor structure in the existing technology.

Figure 1:
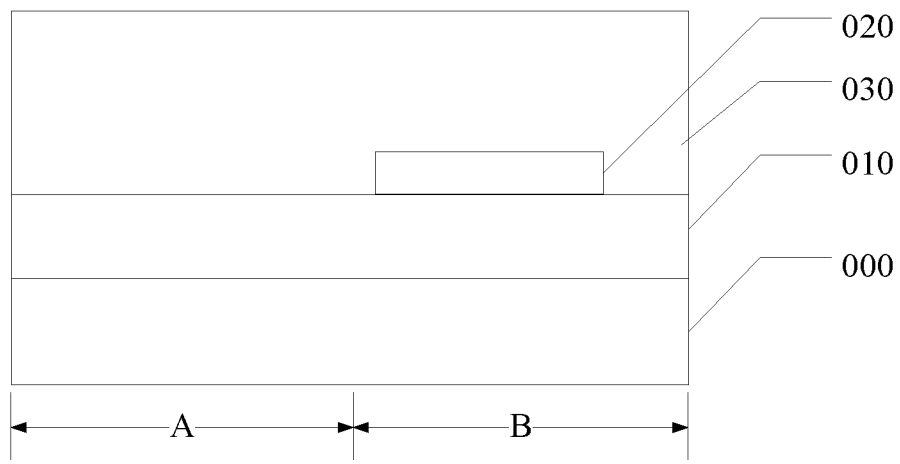
FIGS. 1-4 illustrate cross-sectional structural schematics of a method for forming an exemplary semiconductor structure in the existing technology.

Referring to FIG. 1, a substrate 000 may be provided, where the substrate 000 may include an A region and a B region, and an electrical device may be in the substrate 000. A first dielectric layer 010 may be formed on the surface of the substrate 000. A resistor 020 may be formed on a portion of the surfaces of the first dielectric layer 010 at the A region. A second dielectric layer 030 may be formed on the surface of the resistor 020 and on the exposed surface of the first dielectric layer 010.

Figure 2:
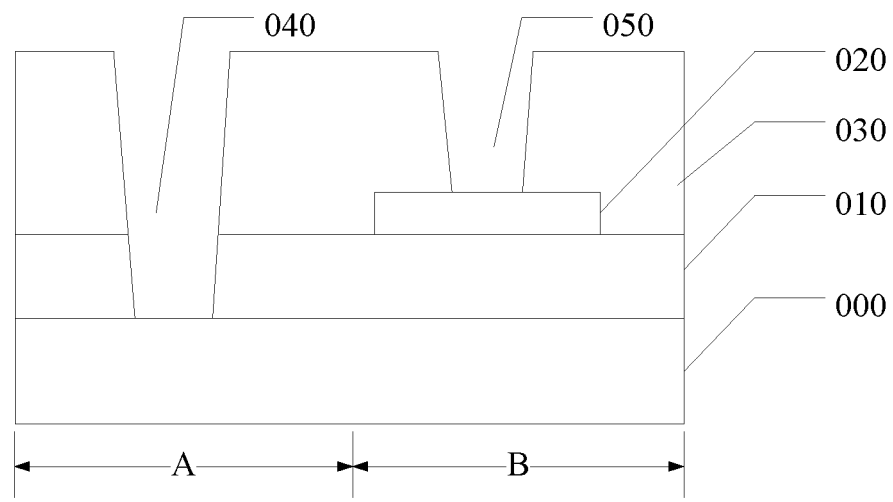

Referring to FIG. 2, a first opening 040 may be formed in the first dielectric layer 010 and the second dielectric layer 030 at the A region, and the bottom of the first opening 040 may expose a portion of the surfaces of the electrical device. A second opening 050 may be formed in the second dielectric layer 030 at the B region, and the bottom of the second opening 050 may expose the surface of the resistor 020.

Figure 3:
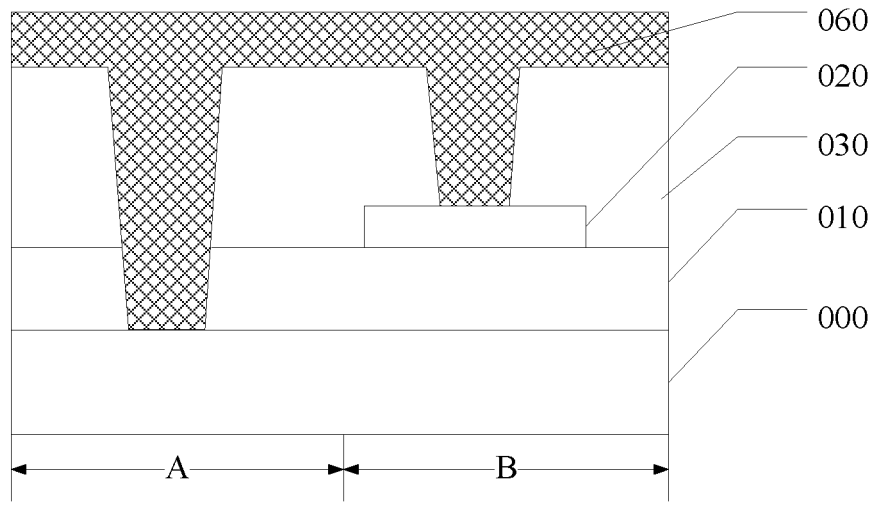

Referring to FIG. 3, an initial plug material 060 may be deposited in the first opening 040, the second opening 050, and on the surface of the second dielectric layer 030.

Figure 4:
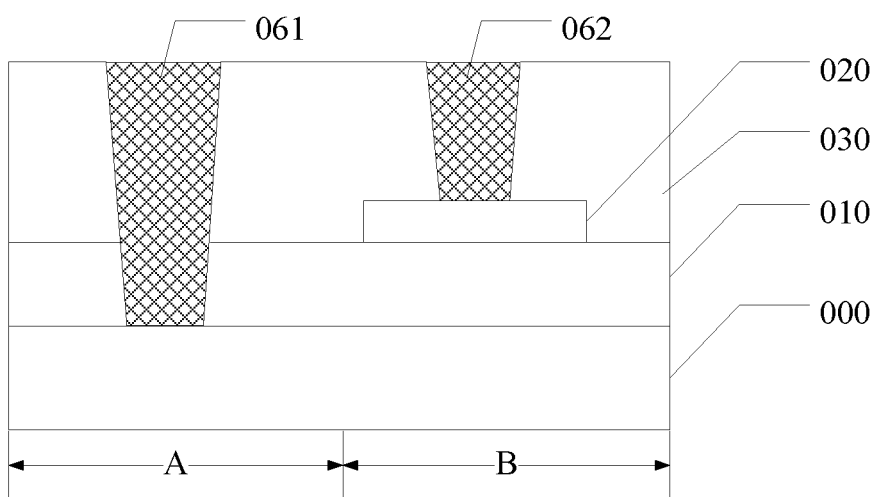

Referring to FIG. 4, a planarization process may be performed on the initial plug material layer 060 till the top surface of the second dielectric layer 030 is exposed to form a first plug 061 and a second plug 062.

In the semiconductor structure formed by the above-mentioned fabrication method, the first plug 061 electrically interconnected to the electrical device and the second plug 062 electrically interconnected to the resistor 020 may be formed.

However, on the one hand, the bottom surface of the first opening 040 is on the surface of the first dielectric layer 010, and the bottom surface of the second opening 050 is on the surface of the resistor 020, that is, the depth of the first opening 040 is greater than the depth of the second opening 050. Therefore, after forming the initial plug material layer 060, the surface of the initial plug material layer 060 on the resistor 020 may be higher than the surface of the initial plug material layer 060 at other portions other than the resistor 020. As a result, when the initial plug material layer 060 is planarized to form the first plug 061 and the second plug 062, it may be not only not beneficial for achieving a relatively flat surface of the semiconductor structure, but also be easy for the residue of the initial plug material layer 060 to be formed on the surface of the second dielectric layer 030, so that the performance of the formed semiconductor structure may be reduced.

On the other hand, the initial plug material layer 060 is formed using a deposition process, so that defects such as voids may be easily formed in the first plug 061 and the second plug 062, which may increase the contact resistance when the first plug 061 is electrically interconnected to the electrical device and the contact resistance when the second plug 062 is electrically interconnected to the electrical device, thereby reducing the performance of the semiconductor structure.

In order to solve the above-mentioned technical problems, the embodiments of the present disclosure provide a semiconductor structure and its fabrication method. The performance of the semiconductor structure may be enhanced by reducing the height difference between the first plug and the second plug formed and by using a selective metal growth process to form the first plug and the second plug.

In order to clearly illustrate the above-mentioned described objectives, features, and advantages of the present disclosure, various embodiments of the present disclosure are described in detail with reference to the accompanying drawings hereinafter.

FIGS. 5-10 illustrate cross-sectional structural schematics of a method for forming an exemplary semiconductor structure according to various disclosed embodiments of the present disclosure.

Figure 5:
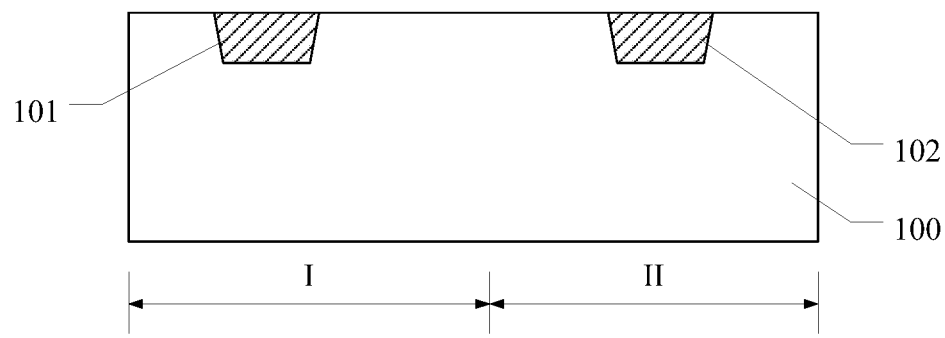
FIGS. 5-10 illustrate cross-sectional structural schematics of a method for forming an exemplary semiconductor structure according to various disclosed embodiments of the present disclosure.

Referring to FIG. 5, a substrate 100 may be provided; the substrate 100 may include a first region I and a second region II; the first region I may have a first metal structure 101 and the second region II may have a second metal structure 102; and the surface of the substrate 100 may expose the top surface of the first metal structure 101 and the top surface of the second metal structure 102 (e.g., in S801 of FIG. 11).

The substrate 100 may be made of a semiconductor material.

In one embodiment, the substrate 100 may be made of silicon. In other embodiments, the substrate 100 may be made of a material including silicon carbide, silicon germanium, a multi-component semiconductor material composed of group III-V elements, silicon-on-insulator (SOI), germanium-on-insulator (GOI), and/or any other suitable material(s). The multi-component semiconductor material composed of group III-V elements may include InP, GaAs, GaP, InAs, InSb, InGaAs, InGaAsP, and/or any other suitable material(s).

In one embodiment, the substrate 100 may include a base substrate (not shown) and a third dielectric layer (not shown) on the surface of the base substrate. The base substrate at the first region I may have one or more semiconductor devices. The semiconductor devices may include one or more of PMOS (p-type metal-oxide-semiconductor) transistors and NMOS (n-type metal-oxide-semiconductor) transistors. The substrate 100 may also include an interconnection structure electrically connected to the semiconductor devices and an insulation layer surrounding the semiconductor devices and the interconnection structure.

In one embodiment, a first blocking layer (not shown) may be on the surface of the first metal structure 101, and a second blocking layer (not shown) may be on the surface of the second metal structure 102. For example, the surface of the substrate 100 may expose each of the surfaces of the first blocking layer and the second blocking layer.

In one embodiment, the material of the first blocking layer may be same as the material of the second blocking layer.

In one embodiment, the first metal structure 101 and the second metal structure 102 may both in the third dielectric layer.

The first metal structure 101, on the one hand, may be used to be electrically interconnected to the semiconductor devices at the first region I, and on the other hand, may be used as the metal substrate for growing the material of the first plug when the selective metal growth process is subsequently used to form the first plug.

The second metal structure 102 may be used as the metal substrate for growing the material of the second plug when the selective metal growth process is subsequently used to form the second plug.

In one embodiment, the first metal structure 101 and the second metal structure 102 may both in the insulation layer.

In one embodiment, the insulation layer may be made of silicon nitride.

In other embodiments, the insulation layer may be made of a material including silicon oxide, silicon oxide nitride, silicon oxide carbide, silicon carbide nitride, silicon oxide carbide nitride, and/or any other suitable material(s).

In one embodiment, the material of the first metal structure 101 may be same as the material of the second metal structure 102.

The material of the first metal structure 101 and the material of the second metal structure 102 are same. Therefore, when the first plug and the second plug are subsequently formed using the selective metal growth process, the growth rate difference between the material of the first metal structure and the material of the second metal structure may be reduced, and furthermore, the height difference between the material of the first metal structure and the material of the second metal structure during the growth may be reduced. In such way, it is beneficial for reducing the residues of the materials of the first metal structure and the second metal structure formed on the surface of the device layer, thereby improving the performance of the semiconductor structure.

In one embodiment, the material of the first metal structure 101 may be different from the material of the second metal structure 102.

In one embodiment, the material of the first metal structure 101 may include one of tungsten or cobalt.

In one embodiment, the material of the second metal structure 102 may include one of tungsten or cobalt.

In one embodiment, the top surface of the first metal structure 101 may be coplanar with the top surface of the second metal structure 102.

The top surface of the first metal structure 101 is coplanar with the top surface of the second metal structure 102. Therefore, when forming the first plug and the second plug subsequently, the materials of the first plug and the second plug may grow from a plane with a same height. It is beneficial for reducing the height difference between the material of the first metal structure and the material of the second metal structure during the growth, and further beneficial for reducing the residues of the materials of the first metal structure and the second metal structure formed on the surface of the device layer, thereby improving the performance of the semiconductor structure.

In one embodiment, the top surface of the first metal structure 101 may not be coplanar with the top surface of the second metal structure 102.

In one embodiment, a device layer may be subsequently formed on each of the surfaces of the substrate 100, the first metal structure 101, and the second metal structure 102; the device layer at the second region II may include a first device; and the projection of the first device on the surface of the substrate may at least partially overlap the top surface of the second metal structure 102 (e.g., in S802 of FIG. 11). The device layer may further include a first dielectric layer and a second dielectric layer on the surface of the first dielectric layer. The first device may be between the first dielectric layer and the second dielectric layer. The detailed process for forming the device layer may refer to FIGS. 6-8.

Figure 6:
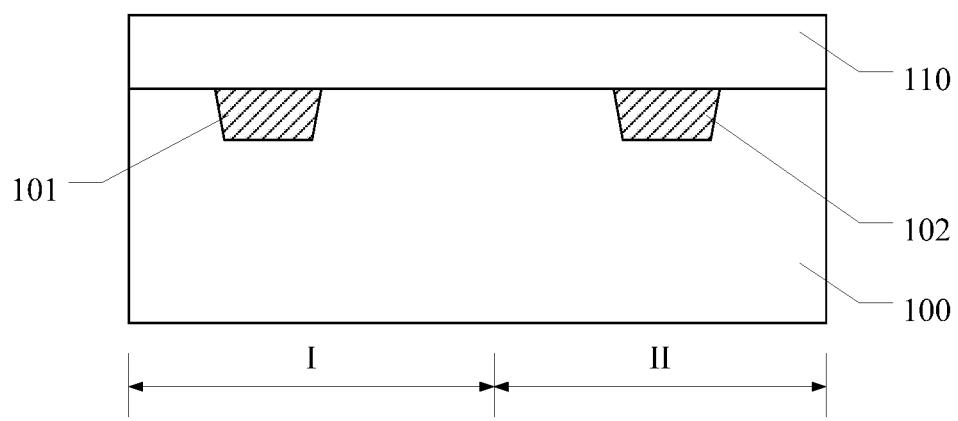

Referring to FIG. 6, a first dielectric layer 110 may be formed on each of the surfaces of the substrate 100, the first metal structure 101, and the second metal structure 102.

The first dielectric layer 110, on the one hand, may be used to protect the substrate 100, the first metal structure 101, and the second metal structure 102, thereby, in a subsequent process, reducing the damage of the substrate 100, the first metal structure 101, and the second metal structure 102 caused by the process; on the other hand, the first dielectric layer 110 may be used to insulate the first device formed subsequently from the substrate 100.

The process for forming the first dielectric layer 110 may include an epitaxial process, a spin coating process, a deposition process, or a combination thereof.

In one embodiment, the process for forming the first dielectric layer 110 may include a chemical vapor deposition process.

The first dielectric layer 110 may be made of a material including silicon oxide, silicon nitride, tantalum nitride, silicon carbide nitride, silicon nitride boride, silicon oxide carbide nitride, silicon oxide nitride, and/or any other suitable material(s).

In one embodiment, the first dielectric layer 110 may be made of silicon oxide.

Figure 7:
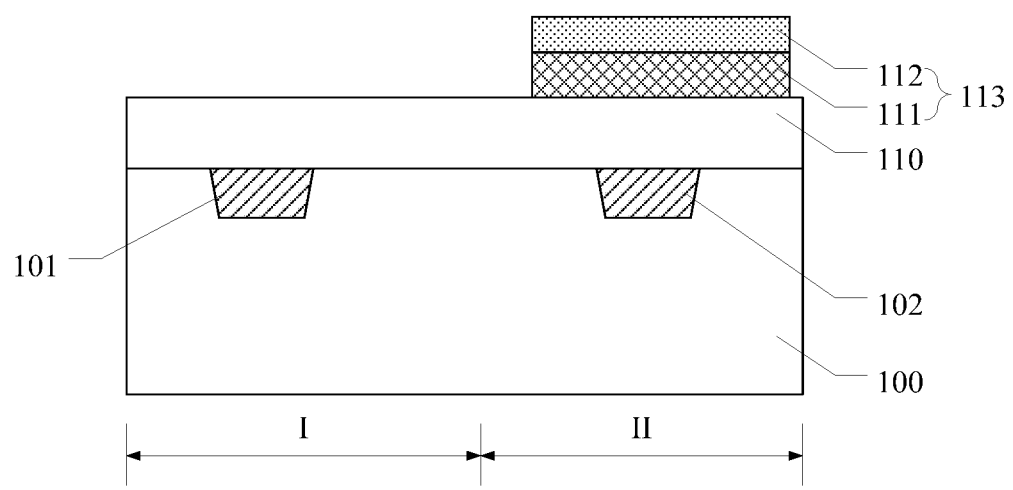

Referring to FIG. 7, a first device 113 may be formed on the surface of the first dielectric layer 110 at the second region II.

In one embodiment, the first device may include a resistance layer 111 and a stop layer 112 on the surface of the resistance layer 111.

The stop layer 112 is formed on the surface of the resistance layer 111, such that the oxidation of the resistance layer 111 may be improved; and, during subsequent processes, including etching, for forming the semiconductor structure, the resistance layer 111 may be protected to reduce the influence of subsequent processes including etching on the resistance layer 111, thereby improving the performance of the semiconductor structure.

In one embodiment, forming the first device 113 may include forming a material layer of the resistance layer (not shown) on the surface of the first dielectric layer 110; forming a material layer of the stop layer (not shown) on the surface of the material layer of the resistance layer; forming a first patterned layer (not shown) on a portion of the surfaces of the material layer of the stop layer at the second region II; and using the first patterned layer as a mask, etching the material layer of the stop layer and the material layer of the resistance layer till exposing the surface of the first dielectric layer 110.

The projection of the first patterned layer on the surface of the substrate 100 may at least partially overlap the top structure of the second metal structure 102 thereof. Therefore, the projection of the first device 113 on the surface of the substrate 100 may at least partially overlap the top surface of the second metal structure 102.

The projection of the first device 113 on the surface of the substrate 100 may at least partially overlap the top surface of the second metal structure 102, which may be beneficial for, after subsequently forming a second through hole passing through the first device, forming the second plug electrically interconnected to the first device in the second through hole using the selective growth process.

The process for forming the material layer of the resistance layer may include a deposition process, a metal plating process, or a combination thereof.

The process for forming the material layer of the stop layer may include a deposition process, an epitaxial process, or a combination thereof.

The process for etching the material layer of the stop layer and the material layer of the resistance layer may include a dry etching process, a wet etching process, or a combination thereof.

In one embodiment, the resistance layer 111 may be made of titanium nitride.

In one embodiment, the stop layer 112 may be made of silicon nitride.

Figure 8:
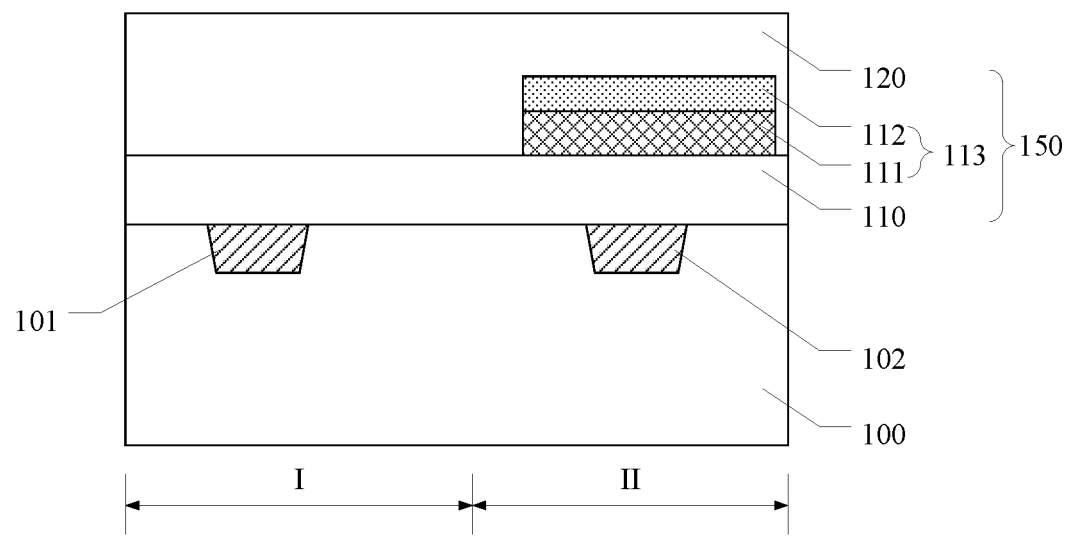

Referring to FIG. 8, a second dielectric layer 120 may be formed on the surfaces of the first dielectric layer 110 and the first device 113.

Therefore, a device layer 150 is (not shown) may be formed, where the device layer 150 may include includes the first dielectric layer 110, the second dielectric layer 120, and the first device 113 between the first dielectric layer 110 and the second dielectric layer 120.

The second dielectric layer 120 may be used to protect the first device 113, such that, in the subsequent process, the damage of the first device 113 caused by the process may be reduced.

The process for forming the second dielectric layer 120 may include an epitaxial process, a spin coating process, a deposition process, or a combination thereof.

In one embodiment, the process for forming the second dielectric layer 120 may include a chemical vapor deposition process.

The second dielectric layer 120 may be made of a material including silicon oxide, silicon nitride, tantalum nitride, silicon carbide nitride, silicon nitride boride, silicon oxide carbide nitride, silicon oxide nitride, and/or any other suitable material(s).

In one embodiment, the second dielectric layer 120 may be made of silicon oxide.

Figure 9:
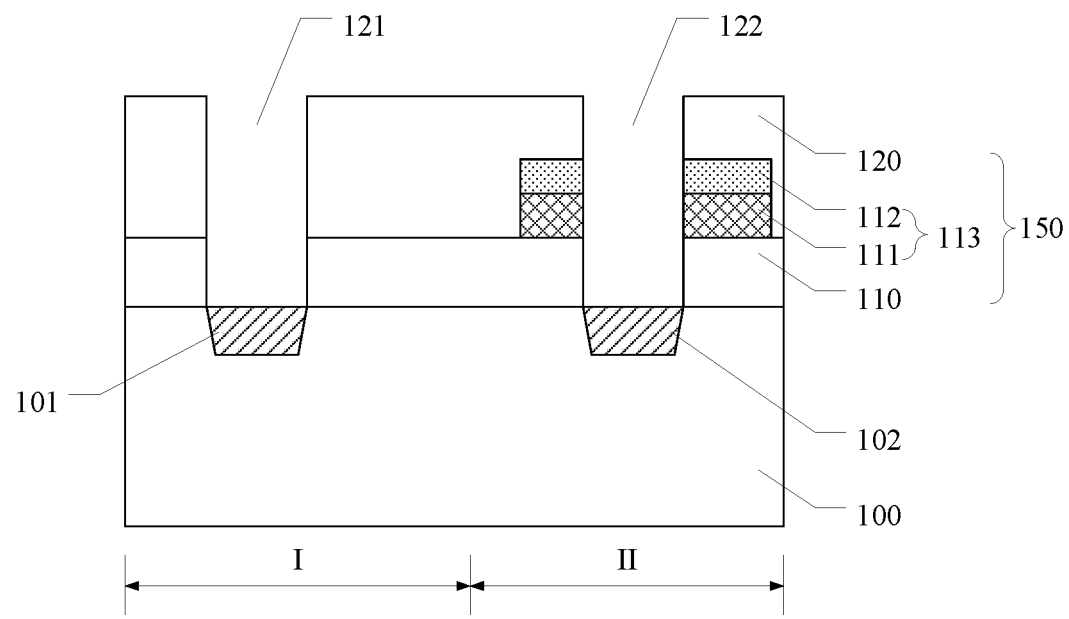

Referring to FIG. 9, a first through hole 121 may be formed in the device layer at the first region I and expose at least a portion of surfaces of the first metal structure 101; and a second through hole 122 may be formed in the device layer at the second region II, where the second through hole 122 may pass through the first device 113 and expose at least a portion of surfaces of the second metal structure 102 (e.g., in S803 of FIG. 11).

Forming the first through hole 121 and the second through hole 122 may include forming a second patterned layer (not shown) on the surface of the second dielectric layer 120, where the second patterned layer may expose a portion of the surfaces of the second dielectric layer 120; using the patterned layer as a mask, etching the second dielectric layer 120, the first dielectric layer 110, and the first device 113 till the top surfaces of the first metal structure 101 and the second metal structure 102 are exposed.

In one embodiment, etching the second dielectric layer 120, the first dielectric layer 110, and the first device 113 till the top surfaces of the first metal structure 101 and the second metal structure 102 are exposed may include using the second patterned layer as a mask, performing a first etching process to etch the second dielectric layer 120 and the first dielectric layer 110 at the first region I till exposing the surface of the first blocking layer and to etch the second dielectric layer 120 at the second region II till exposing the surface of the first device 113 (i.e., the surface of the stop layer 112); after performing the first etching process, performing a second etching process on the stop layer 112 till exposing the surface of the resistance layer 111; after performing the second etching process, performing a third etching process on the resistance layer 111 till exposing the surface of the first dielectric layer 110; after performing the third etching process, performing the first etching process on the first dielectric layer 110 at the first region I till exposing the surface of the second blocking layer; and after performing the first etching on the first dielectric layer 110 at the first region I, performing a fourth etching process on the first blocking layer and the second blocking layer till the top surfaces of the first metal structure 101 and the second metal structure 102 are exposed.

It should be noted that the etching rate of the first blocking layer may be less than the etching rate of each of the first dielectric layer 110 and the second dielectric layer 120 by the first etching process; the etching rate of the first blocking layer may be less than the etching rate of the stop layer 112 by the second etching process; the etching rate of the first blocking layer may be less than the etching rate of the resistance layer 111 by the third etching process; therefore, when the stop layer 112, the resistance layer 111 and the first dielectric layer 110 at the second region II are etched, the first blocking layer may block the damage to the surface of the first metal structure 101 by the first etching process, the second etching process, and the third etching process.

In one embodiment, the first through hole 121 and the second through hole 122 may be formed by a process including a dry etching process, a wet etching process, or a combination thereof.

Figure 10:
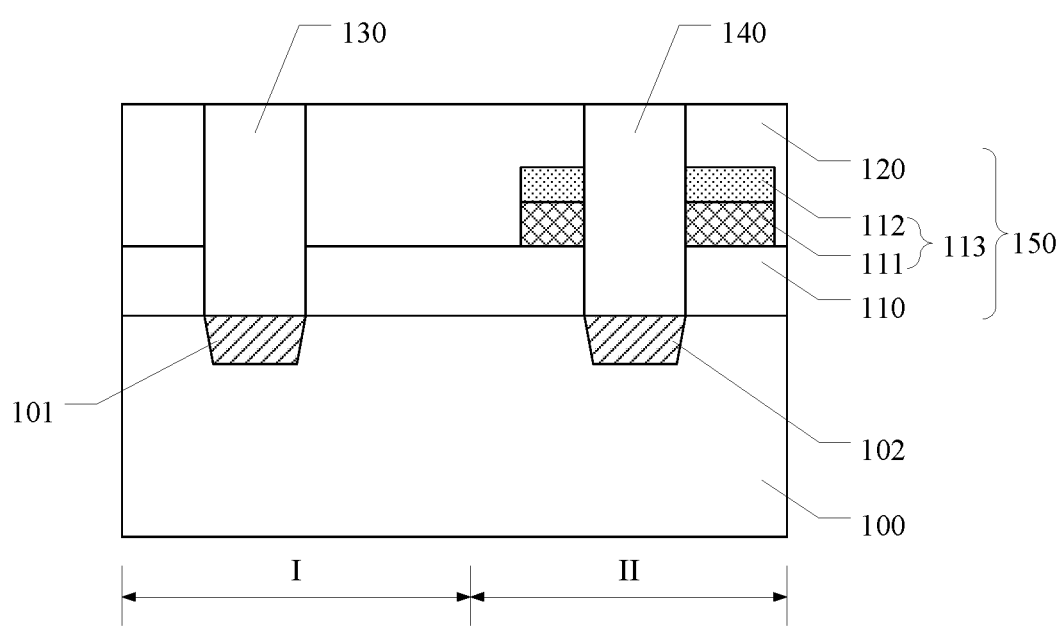

Referring to FIG. 10, using the selective metal growth process, a first plug 130 may be formed in the first through hole 121, and a second plug 140 may be formed in the second through hole 122 (e.g., in S804 of FIG. 11).

On the one hand, the first through hole 121 and the second through hole 122 are formed in the device layer, the first plug 130 is formed in the first through hole 121 and the second plug 140 is formed in the second through hole 122, such that the height difference between the first plug 130 and the second plug 140 finally formed may be reduced. On the other hand, the first plug 130 and the second plug 140 are formed by the selective metal growth process, the material forming the first plug 130 may start to grow from the bottom of the first through hole 121, and the material forming the second plug 140 may start to grow from the bottom of the second through hole 122, such that the height difference between the material of the first plug 130 and the material of the second plug 140 during the growth may become small, which is beneficial for the subsequent planarization process, thereby reducing the residues formed on the surface of the device layer by the material of the first plug 130 and the material of the second plug 140. Meanwhile, the material of the first plug 130 and the material of the second plug 140 are difficult to grow on the surface of the device layer, thereby reducing the residues formed on the surface of the device layer by the material of the first plug 130 and the material of the second plug 140. The residues formed on the surface of the device layer by the material of the first plug 130 and the material of the second plug 140 are reduced, and the second through hole 122 passes through the first device 113, such that, when forming the second plug 140 electrically interconnected to the first device 113, the influence of the resides on the performance of the semiconductor structure may be reduced, thereby improving the performance of the semiconductor structure.

Furthermore, the selective metal growth process is used to form the first plug 130 and the second plug 140, such that the defects such as voids in the first plug 130 and the second plug 140 may be reduced. On the one hand, the quality of the first plug 130 and the second plug 140 may be improved; on the other hand, the contact resistance of the first plug 130 and the second plug 140 may be reduced, thereby improving the performance of the semiconductor structure.

In one embodiment, forming the first plug 130 and the second plug 140 may include, using the selective growth process, forming a plug material layer (not shown) in the first through hole 121 and the second through hole 122 till the top surface of the plug material layer is coplanar with the top surface of the second dielectric layer 120 or higher than the top surface of the second dielectric layer 120.

The plug material layer may be used to form the first plug 130 and the second plug 140.

In one embodiment, the top surface of the plug material layer is higher than the top surface of the second dielectric layer 120.

In one embodiment, after the plug material layer is formed, the plug material layer may be planarized till being coplanar with the surface of the second dielectric layer 120.

The plug material layer may be planarized by a chemical mechanical planarization process.

In one embodiment, the materials of the first plug 130, the second plug 140, the first metal structure 101, and the second metal structure 102 may be same.

The materials of the first plug 130, the second plug 140, the first metal structure 101, and the second metal structure 102 are same, such that the material growth rates of the material of the first plug 130 and the material of the second plug 140 may be same, which may greatly reduce the height difference between the material of the first plug 130 and the material of the second plug 140 during growth, and furthermore may be greatly beneficial for reducing the residues formed on the surface of the device layer by the material of the first plug 130 and the material of the second plug 140, thereby improving the performance of the semiconductor structure.

In one embodiment, the materials of the first plug 130 and the second plug 140 may be same, and the materials of the first plug 130 and the second plug 140 may be different from the materials of the first metal structure 101 and the second metal structure 102.

The materials of the first plug 130 and the second plug 140 are same, such that the material growth difference between the material of the first plug 130 and the material of the second plug 140 may be reduced, which may greatly reduce the height difference between the material of the first plug 130 and the material of the second plug 140 during growth, and furthermore may be beneficial for reducing the residues formed on the surface of the device layer by the material of the first plug 130 and the material of the second plug 140, thereby improving the performance of the semiconductor structure.

In other embodiments, the materials of the first plug and the second plug may be different.

In one embodiment, the first plug 130 may be made of one of tungsten or cobalt.

In one embodiment, the second plug 140 may be made of one of tungsten or cobalt.

Correspondingly, the embodiments of the present disclosure provide a semiconductor structure formed by any one of the above-mentioned fabrication methods. Referring to FIG. 10, the semiconductor structure may include the substrate 100, where the substrate 100 may include the first region I and the second region II, the first region I may have the first metal structure 101, the second region II may have the second metal structure 102, and the surface of the substrate 100 may expose each of the top surfaces of the first metal structure 101 and the second metal structure 102; the device layer on each of the surfaces of the substrate 100, the first metal structure 101, and the second metal structure 102, where the first device 113 may be in the device layer at the second region II, and the projection of the first device 113 on the surface of the substrate may at least partially overlap the top surface of the second metal structure 102; the first through hole 121 in the device layer at the first region I where the first through hole 121 may expose at least a portion of surfaces of the first metal structure 101, and the second through hole 122 in the device layer at the second region II where the second through hole 122 may pass through the first device 113 and expose at least of a portion of surfaces of the second metal structure 102; and the first plug 130 in the first through hole 121 and the second plug 140 formed in the second through hole 122, each formed using the selective metal growth process.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A method for fabricating a semiconductor structure, comprising:
   providing a substrate, wherein the substrate includes a first region having a first metal structure and a second region having a second metal structure, and a top surface of the substrate exposes each top surface of the first metal structure and the second metal structure;
   forming a device layer on each of top surfaces of the substrate, the first metal structure and the second metal structure, wherein the device layer at the second region includes a first device, and a projection of the first device on the top surface of the substrate at least partially overlaps the top surface of the second metal structure;
   forming a first through hole in the device layer at the first region and forming a second through hole in the device layer at the second region, wherein the first through hole exposes at least a portion of surfaces of the first metal structure, the second through hole penetrates the first device and exposes at least a portion of surfaces of the second metal structure under the first device, and a depth of the first through hole is equal to a depth of the second through hole that is adjacent to the first through hole; and using a selective metal growth process, forming a first plug in the first through hole and forming a second plug in the second through hole.

2. The method according to claim 1, wherein:
a material of the first metal structure is same as a material of the second metal structure.

3. The method according to claim 1, wherein:
materials of the first metal structure, the second metal structure, the first plug, and the second plug are all same.

4. The method according to claim 1, wherein:
the top surface of the first metal structure is coplanar with the top surface of the second metal structure.

5. The method according to claim 1, wherein:
the first device includes a resistance layer.

6. The method according to claim 1, wherein:
the device layer includes a first dielectric layer, a second dielectric layer, and the first device between the first dielectric layer and the second dielectric layer; and
the second dielectric layer is separated from the first device by the first dielectric layer.

7. The method according to claim 1, wherein forming the first plug and the second plug includes:
using the selective metal growth process, forming a plug material layer in the first through hole and the second through hole till a top surface of the plug material layer is coplanar with a top surface of the second dielectric layer or higher than a top surface of the second dielectric layer.

8. The method according to claim 1, wherein:
the first metal structure is made of a material including tungsten, cobalt, or a combination thereof; and/or
the second metal structure is made of a material including tungsten, cobalt, or a combination thereof.

9. The method according to claim 1, wherein:
the first plug is made of a material including tungsten, cobalt, or a combination thereof.

10. The method according to claim 1, wherein:
the second plug is made of a material including tungsten, cobalt, or a combination thereof.

11. The method according to claim 1, wherein:
forming the first plug in the first through hole includes growing a material of the first plug from a bottom of the first through hole;
forming the second plug in the second through hole includes growing a material of the second plug from a bottom of the second through hole; and
a height of the first plug is equal to a height of the second plug.

12. The method according to claim 1, wherein:
the device layer at the first region does not include the first device; and
the first through hole does not penetrate the first device.

13. The method according to claim 2, wherein:
a material of the first plug is same as a material of the second plug.

14. The method according to claim 5, wherein:
the resistance layer is made of titanium nitride.

15. The method according to claim 5, wherein:
the first device further includes a stop layer on the resistance layer.

16. The method according to claim 6, wherein forming the device layer includes:
forming the first dielectric layer on the each of the top surfaces of the substrate, the first metal structure and the second metal structure;

forming the first device on a top surface of the first dielectric layer at the second region; and forming the second dielectric layer on surfaces of the first dielectric layer and the first device.

17. The method according to claim 6, wherein:

the first dielectric layer is made of a material including silicon oxide, silicon nitride, tantalum nitride, silicon carbide nitride, silicon nitride boride, silicon carbide oxide nitride, silicon oxide nitride, or a combination thereof; and the second dielectric layer is be made of a material including silicon oxide, silicon nitride, tantalum nitride, silicon carbide nitride, silicon nitride boride, silicon carbide oxide nitride, silicon oxide nitride, or a combination thereof.

18. The method according to claim 6, wherein:

forming the first through hole includes etching the second dielectric layer and etching the second dielectric layer to expose the portion of the surfaces of the first metal structure; and forming the second through hole includes etching the second dielectric layer, etching the first device, and etching the first dielectric layer to expose the portion of the surfaces of the second metal structure.

19. The method according to claim 7, wherein forming the first plug and the second plug further includes:

planarizing the plug material layer till being coplanar with the top surface of the second dielectric layer, wherein the plug material layer is planarized by a chemical mechanical planarization process.

20. A semiconductor structure, comprising:

a substrate, wherein the substrate includes a first region having a first metal structure and a second region having a second metal structure, and a top surface of the substrate exposes each top surface of the first metal structure and the second metal structure;

a device layer on each of top surfaces of the substrate, the first metal structure and the second metal structure, wherein the device layer at the second region includes a first device, and a projection of the first device on the top surface of the substrate at least partially overlaps the top surface of the second metal structure;

a first through hole in the device layer at the first region, wherein the first through hole exposes at least a portion of surfaces of the first metal structure;

a second through hole in the device layer at the second region, wherein the second through hole penetrates the first device and exposes at least a portion of surfaces of the second metal structure, and a depth of the first through hole is equal to a depth of the second through hole that is adjacent to the first through hole; and a first plug in the first through hole and a second plug in the second through hole, each formed using a selective metal growth process.

\* \* \* \* \*